United States Patent [19]

Ault

[11] 4,053,751

[45] Oct. 11, 1977

[54] ADAPTABLE EXERCISER FOR A MEMORY SYSTEM

[75] Inventor: Cyrus Frank Ault, Wheaton, Ill.

[73] Assignee: Bell Telephone Laboratories, Incorporated, Murray Hill, N.J.

[21] Appl. No.: 680,988

[22] Filed: Apr. 28, 1976

[51] Int. Cl.² ................... G11C 29/00; G06F 11/10
[52] U.S. Cl. .................. 235/302.3; 340/146.1 A X; 340/174 ED
[58] Field of Search ............. 235/153 AM, 153 AC; 340/146.1 A X, 172.5, 174 ED; 445/1

[56] References Cited

U.S. PATENT DOCUMENTS

| | | | |
|---|---|---|---|
| 3,248,697 | 4/1966 | Montgomery | 340/146.1 A X |
| 3,372,376 | 3/1968 | Helm | 340/146.1 A X |
| 3,534,403 | 10/1970 | Matarese | 340/146.1 A X |
| 3,570,008 | 3/1971 | Downing et al. | 340/172.5 |
| 3,792,450 | 2/1974 | Bogar et al. | 340/174 ED |
| 3,906,200 | 9/1975 | Petschauer | 235/153 AM |
| 3,909,810 | 9/1975 | Naden et al. | 340/174 ED |
| 3,934,224 | 1/1976 | Dulaney et al. | 340/146.1 A X |

FOREIGN PATENT DOCUMENTS

| | | | |
|---|---|---|---|
| 1,238,162 | 3/1969 | United Kingdom | 340/146.1 A X |

*Primary Examiner*—Charles E. Atkinson
*Attorney, Agent, or Firm*—John C. Albrecht

[57] ABSTRACT

An adaptable exerciser for a memory system utilizes the error rates of independent memory segments to selectively exercise the segments at different frequencies. Each memory segment has an associated counter which is incremented with errors and decremented at a predetermined rate with time. If the count accumulated in a counter reaches a specified level, the associated memory segment will be exercised at a higher frequency. If the count in any counter should reach a second higher specified level, the associated memory segment is removed from service.

7 Claims, 3 Drawing Figures

ADAPTABLE EXERCISER FOR A MEMORY SYSTEM

FIELD OF THE INVENTION

My invention relates to a method and apparatus for exercising a memory system to detect and correct data errors therein, and more particularly to an exerciser which adjusts the exercise rate of independent memory segments in accordance with their individual error rates.

BACKGROUND OF THE INVENTION

Memory systems accumulate data errors as they operate. Errors occur in most memory systems only if addressed; however, magnetic bubble memories are an exception. Data in bubble memories are continuously circulated to maintain a substantially constant chip temperature to prevent fatigue due to temperature changes. Due to this continuous circulation errors occur at a measurable rate whether or not data is read from or written into the memory. An exerciser is utilized to correct data errors in a memory system by reading the memory, detecting any errors present in the data read, correcting any errors detected, and placing the correct data into the memory.

To ensure memory reliability it must be exercised at a rate dictated by the worst case memory error specification. If the memory is exercised at a slower rate, multiple errors which are not correctable by the exerciser may accumulate in the memory. This worst case exercise rate requires a certain percentage of system access time during which productive processing cannot be conducted. Most memory segments perform many orders of magnitude better than the worst case error specification; accordingly, if memories are exercised at such a rate, productive processing time is needlessly wasted.

SUMMARY OF THE INVENTION

This invention reduces memory exercise time to that required by the actual error rates of individual memory segments such that more productive processing time is available.

In accordance with my invention a memory system comprises a plurality of independent memory units; exercising circuitry for reading each of the memory units at individually selectable rates to detect and to correct errors in the data read and to place the correct data into the memory unit being exercised; a plurality of counter circuits corresponding in number to the plurality of memory units and individually associated therewith, each counter circuit being incremented by errors in the associated memory unit and decremented at a predetermined rate with time; and control circuitry responsive to the counts in the counter circuits for selecting the exercise rates of the individual memory units.

BRIEF DESCRIPTION OF THE DRAWING

The invention will be understood from the following detailed description when read with reference to the drawing, in which.

DETAILED DESCRIPTION

Figure 1:
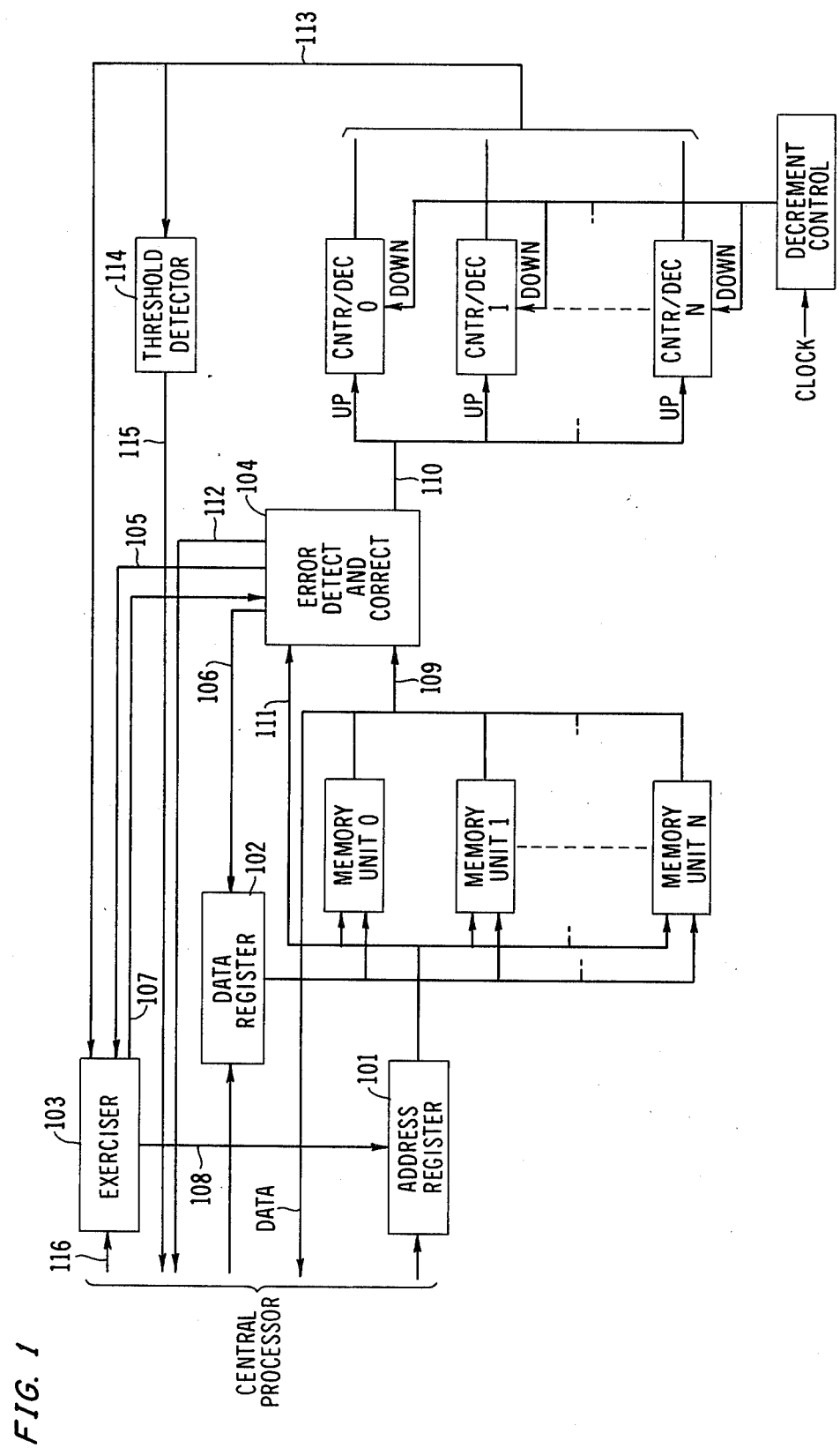
FIG. 1 is a block diagram of a memory system in accordance with my invention.

A magnetic bubble memory system in accordance with my invention is shown in FIG. 1. During productive processing, the central processor accesses the memory system via the address register 101 and the data register 102. The address register 101 receives address information and read/write commands from the central processor while the data register 102 receives data to be written into the memory from the central processor. When the memory is not being accessed by the central processor, a signal is provided to exerciser 103 via the path 116 and the memory units O through N are exercised. A memory unit is exercised by sequentially reading the data from all the locations in the unit, detecting any errors present in the data read, correcting the errors detected, and placing the correct data into the unit. If an error is detected, the error detect and correct circuit 104 corrects the erroneous data, indicates to the exerciser 103 via the path 105 that a correction is required, and delivers the correct data to the data register 102 via the path 106 upon command from the exerciser 103 via the path 107. The exerciser 103 causes the correct data to be placed into the memory unit at the location from which the erroneous data was read.

Figure 2:
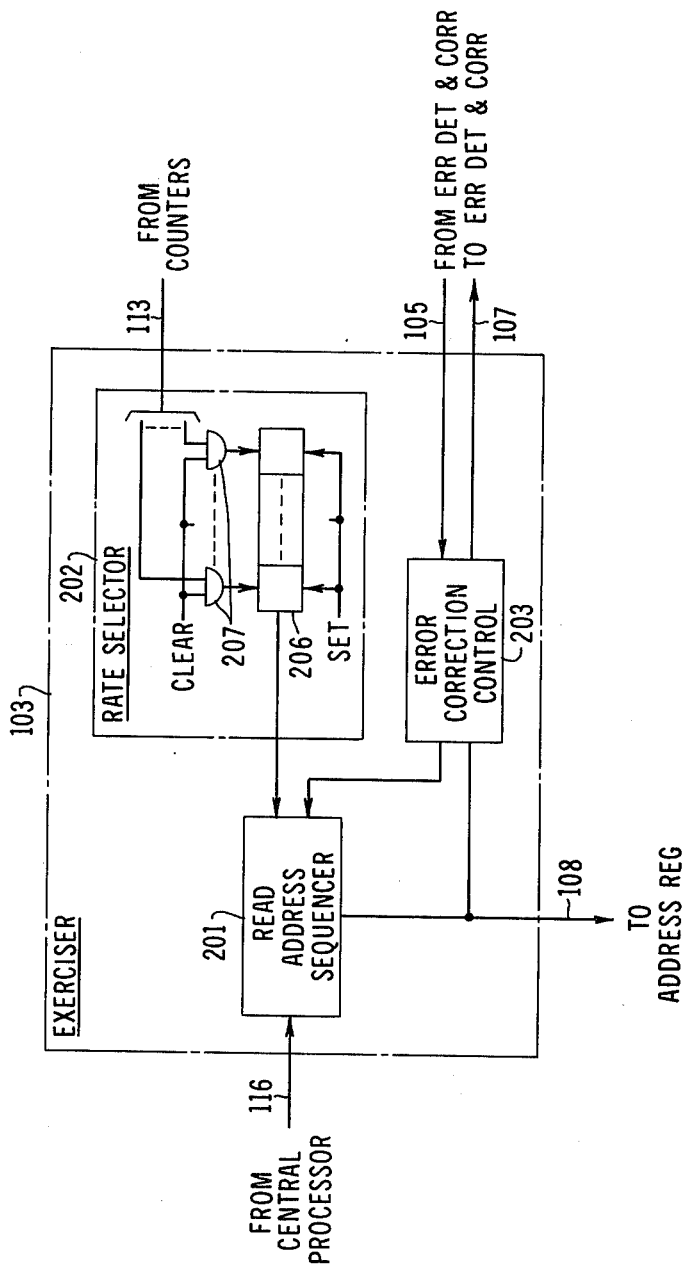
FIG. 2 is a block diagram of the exerciser of FIG. 1.

FIG. 2 shows a block diagram of the exerciser 103. The read address sequencer 201 provides the read address and the read command signals to the address register 101 via the path 108. The read sequence is defined by the rate selector circuit 202 which will be described later herein. When an error is detected and corrected by the error detect and correct circuit 104, a control signal is sent to the error correction control circuit 203 via the path 105 together with the address where the correct data is to be placed into the memory. The error correction control circuit 203 in response to the control signal inhibits the read address sequencer 201, signals the error detect and correct circuit 104 via the path 107 to transfer the correct data to the data register 102, and provides the address at which the correct data is to be written and a write command to the address register 101 via the path 108. Accordingly, the correct data is placed into the memory.

Figure 3:
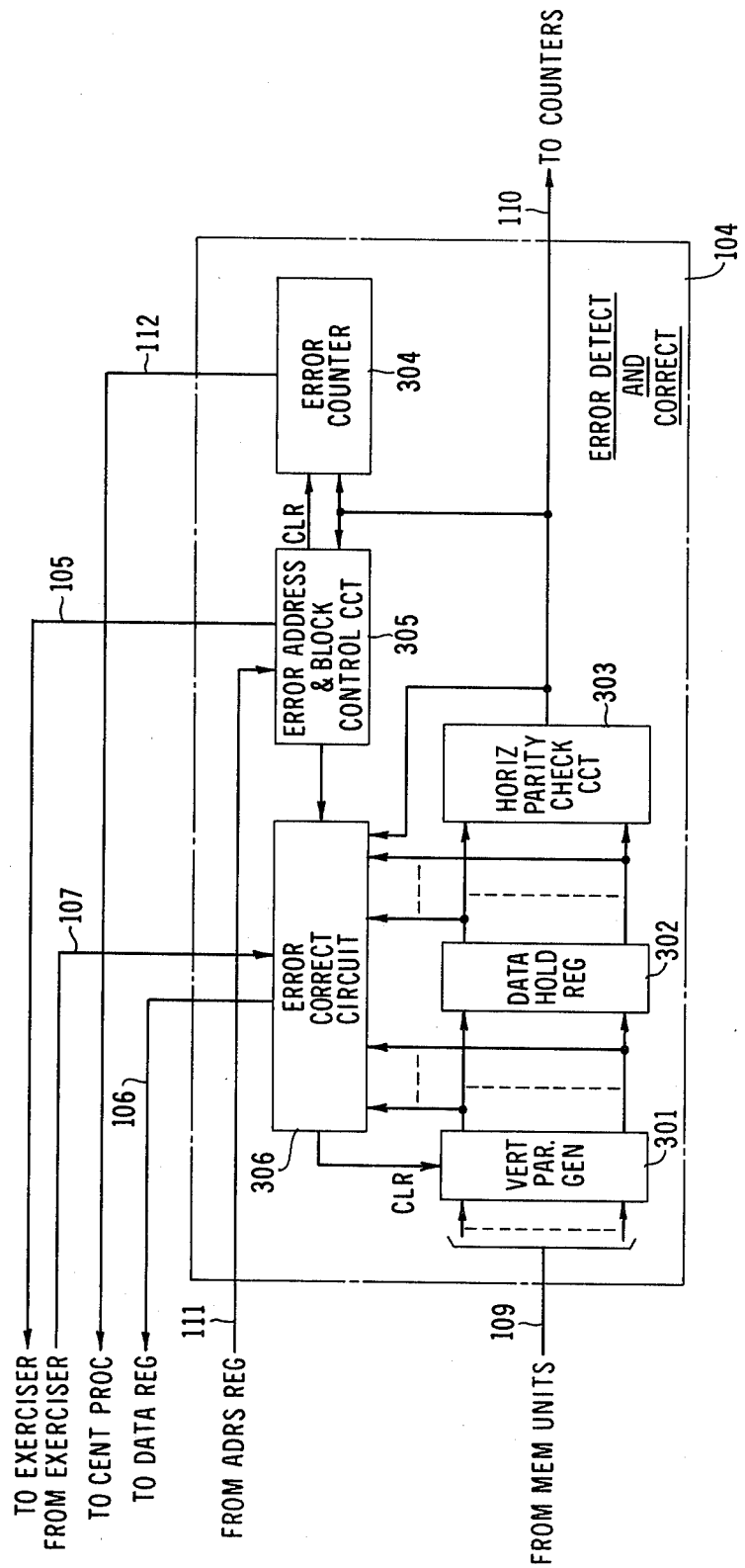
FIG. 3 is a block diagram of the error detect and correct circuit of FIG. 1.

One data error detection and correction scheme which is well known to those skilled in the art is horizontal and vertical parity over data which is block oriented in a memory. Each data word includes a parity bit to provide horizontal parity and each data block includes a parity word over the data and parity bits of the other words of the block to provide vertical parity. Even or odd parity can be used with the selection usually dependent upon the memory system characteristics. One illustrative parity checking arrangement is shown in FIG. 3. Data read in parallel from the memory via the path 109 is buffered through the vertical parity generator 301 to the data hold register 302. A parity check is performed on the data in the data hold register 302 by the horizontal parity check circuit 303. If no error is detected, the next word of the data block is read. If an error is present, an error signal is generated by the horizontal parity check circuit 303. This error signal increments the counter which is associated with the memory unit being exercised via the path 110, increments the error counter 304, gates the address at which the error was encountered into the error address and block control circuit 305 via the path 111 and gates the erroneous data into the error correct circuit 306. The error counter 304 informs the central processor via the path 112 if multiple errors occur in any block of data since multiple errors cannot be corrected by the illustrative embodiment. After an entire block of data is read, the contents of the vertical parity generator 301 are indicative of the vertical parity of the data block read. Upon completing the reading of a data block, the error address and block control circuit 305 signals the error correct circuit 306 to correct the erroneous data previously gated thereinto by utilizing the contents of the vertical parity generator 301 and thereafter to clear the contents of the vertical parity generator 301. The error counter 304 is also cleared upon completing the reading of a data block. Placement of the correct data into the memory is as previously described. It is recognized that other parity schemes as well as other error detection and correction schemes can be utilized in my invention.

The counters/decoders O through N are individually associated with the memory units O through N. The counters can be up-counted to their maximum capacity at which point further up-counts are inhibited and similarly can be down-counted at zero at which point further down counts are inhibited. The associated decoders provide output signals if the counts in the counters exceed predetermined levels. During exercise periods, if an error is detected, the counter associated with the memory unit being exercised is up-counted. Most memory units have an error rate which is several orders of magnitude better than the worst case specifications. In accordance with this standard error rate, an exercise rate is selected which will correct the errors which occur in most memory units. The counters are down-counted to allow for the errors which are corrected at this exercise rate and to have the counts in the counters indicate the error rates of the associated memory units. If the error rate of a memory unit is equal to or less than the standard error rate, the exercise rate is adequate and the count in the unit's associated counter will remain near zero. If, however, a memory unit's error rate is greater than the standard error rate, the count in its respective counter will accumulate. If the count in any counter reaches a predetermined level, the exercise rate of its associated memory unit is increased. If this increase exercise rate fails to reduce the count to near zero and it reaches a second higher level, the associated memory unit is removed from service and replaced by a backup memory unit by arrangements not shown.

The exercise rate of the individual memory units is determined by the rate selector 202 in response to the output signals from the decoders which are transmitted to the rate selector 202 via the path 113. It will be recognized by one skilled in the art that the individual counter contents can be utilized in a large number of algorithms to control the exercise rates of the individual memory units at a large variety of rates. One such arrangement which allows 20 percent of the memory units to have an error rate which is greater than the standard error rate will be described herein. A certain amount of system access time is required to exercise the memory units at the exercise rate which is dictated by the standard error rate. This required exercise time is divided into M time periods where M = [N+0.2N] (rounded to the next higher integer). The order in which the memory units are exercised is set by the register 206 comprising N stages with each stage corresponding to a memory unit. Initially all stages of the register are set indicating that each memory unit is to be exercised. Upon completing the exercising of all memory units, the register is cleared such that no memory units will be exercised by the rate selector 202 in its next pass through the register. However, if at least one of the memory units has an error count above the first predetermined level, the clear signal for the corresponding stage or stages of the register 206 will be inhibited by the corresponding gates 207 and the unit or units which have the excessive error rates will be exercised a second time before all memory units are again exercised. After the register is interrogated for the second time, all register stages are set and, accordingly, all memory units are again exercised. If more than 20 percent of the memory units have an error rate greater than the standard rate, the exerciser will overload and reduce the exercise rate below that which is dictated by the standard error rate, i.e., more than M time periods would be required to properly exercise the memory units. This exerciser overload is detected by the threshold detector circuit 114 which transmits an overload signal to the central processor via the path 115.

What is claimed is:

1. A memory system comprising:

a plurality of independent memory units;

means for exercising said memory units comprising means for reading data from said memory units and means for placing correct data in said memory units;

error detecting and correcting means connected to said exercising means and to said memory units for receiving data read from said memory units and for detecting and correcting errors in said data, said detecting and correcting means including means for generating error signals;

a plurality of counter means corresponding in number to said plurality of memory units, and individually associated therewith, each of said counter means being incremented by said error signals generated during the exercise of the associated memory unit, and decremented at a predetermined rate with time; and means connected to said exercising means and to said plurality of counter means and responsive to the contents of said plurality of counter means for controlling said exercising means such that each of said memory units is exercised at an individually selectable rate dependent upon the contents of its associated counter means.

2. A memory system in accordance with claim 1 wherein said means for detecting and correcting errors comprises:

means for generating horizontal parity over each data word read from the memory;

means for generating vertical parity over each block of data read from the memory; and means responsive to said horizontal and vertical parity for correcting any single bit error in said block.

3. A memory system in accordance with claim 1 wherein said plurality of independent memory units are magnetic bubble memory units.

4. A memory system comprising:

a plurality of memory units;

means for exercising each of said memory units at individually selectable rates to detect and correct errors in data stored in said memory units, said exercising means including means for generating error signals; and means connected to said memory units and to said exercising means and responsive to the number of said error signals resulting from exercising a particular memory unit for selecting a rate for said particular memory unit.

5. A memory system in accordance with claim 4 wherein said selecting means comprises an up-down counter individual to each of said memory units, means for incrementing said counters responsive to said error signals, and means for decrementing said counters at a predetermined rate with time.

6. A method of exercising a memory system having a plurality of independent memory units and a corresponding plurality of counter circuits individually associated therewith comprising the following steps:
 a. reading data sequentially from the memory units at individually selectable rates;
 b. detecting and correcting errors in said data;
 c. generating error signals in response to said errors detected;
 d. placing correct data into the memory;
 e. incrementing the counter which corresponds to the memory unit being read in response to said error signals;
 f. decrementing the counter which corresponds to the memory unit being read at a predetermined rate with time; and
 g. selecting said rates in accordance with the adjusted error counts contained in the counters.

7. A method in accordance with claim 6 wherein the step of detecting and correcting errors comprises the following steps:
 a. generating horizontal parity over each data word read from the memory;
 b. generating vertical parity over each block of data read from the memory; and
 c. correcting any single bit error in said block in accordance with said parity.

* * * * *